United States Patent [19]
Dolivo et al.

[11] Patent Number: 5,260,976
[45] Date of Patent: Nov. 9, 1993

[54] PREAMBLE RECOGNITION AND SYNCHRONIZATION DETECTION IN PARTIAL-RESPONSE SYSTEMS

[75] Inventors: Francois Dolivo, Waedenswil; Wolfgang Schott, Rueschlikon, both of Switzerland

[73] Assignee: International Business Machines Corporation, Armonk, N.Y.

[21] Appl. No.: 848,567

[22] Filed: Mar. 9, 1992

[30] Foreign Application Priority Data

Mar. 27, 1991 [EP] European Pat. Off. ........ 91810223.7

[51] Int. Cl.$^5$ ........................ H03D 1/00; H04L 27/06
[52] U.S. Cl. ................................... 375/94; 375/116; 371/46
[58] Field of Search ............... 375/94, 116, 114, 106; 371/46, 47.1, 5.4; 370/105.4

[56] References Cited

U.S. PATENT DOCUMENTS

| | | | |
|---|---|---|---|
| 5,012,491 | 4/1991 | Iwasaki | 375/114 |
| 5,050,191 | 9/1991 | No | 375/114 |
| 5,146,475 | 9/1992 | Kubo | 375/94 |

*Primary Examiner*—Curtis Kuntz
*Assistant Examiner*—Hai H. Phan
*Attorney, Agent, or Firm*—Leslie G. Murray

[57] ABSTRACT

A method and apparatus for detection of a timing data sequence and an end-of-preamble (EOP) flag based on a maximum-likelihood (ML) test performed on received data timing samples after synchronization has been achieved is described. The preamble preceding transmitted user data consists of a timing sequence followed by a known sequence of bits marking its end. After detection of synchronization, the receipt of the timing data sequence is recognized when an ML test detects no more than $n_V$ violations during a sequence of $n_I$ received samples. Similarly, the receipt of the EOP flag is recognized as soon as $n_F$ violations an ML test have occurred in the received sample sequence after recognition of the timing data sequence.

20 Claims, 4 Drawing Sheets

TIMING SEQUENCE REPLICA

PREAMBLE RECOGNITION AND SYNCHRONIZATION DETECTION IN PARTIAL-RESPONSE SYSTEMS

TECHNICAL FIELD

The invention relates to a method for fast and reliable recognition of the reception of the synchronization preamble in the receiver of communication or storage systems using partial-response signaling. The synchronization preamble is transmitted preceding user data for fast initial gain and timing phase adjustment in the receiver; it consists of a timing sequence followed by a known sequence of bits marking its end. The timing sequence does not satisfy the constraints of a rate 8/9 code used in partial-response systems and serves as a unique synchronization mark. The inventive method provides a means for reliably recognizing that synchronization has been achieved, the timing sequence is being received, and the end of preamble has been detected. The inventive method for detecting preamble reception is based on a maximum-likelihood test performed on the received samples after synchronization has been achieved. The same test is used to detect the end of preamble. In addition, a hardware implementation of a preamble-reception detector based on the inventive method is described.

BACKGROUND OF THE INVENTION

In receivers for storage and communication systems, the output signal of a receive filter is scaled and sampled prior to performing symbol-by-symbol or symbol sequence detection, as described by several authors, e.g. H. Kobayashi in "Simultaneous Adaptive Estimation and Decision Algorithm for Carrier Modulated Data Transmission Systems", IEEE Trans. Commun., vol. COM-19, pp. 268-280, June 1971, and G. Forney, "Maximum-Likelihood Sequence Estimation of Digital Sequences in the Presence of Intersymbol Interference", IEEE Trans. Inform. Theory, vol. IT-18, pp. 363-378, May 1972, and G. Ungerböck, "Adaptive Maximum-Likelihood Receiver for Carrier-Modulated Data-Transmission Systems", IEEE Trans. Commun., vol. COM-22, pp. 624-636, May 1974. A gain control and a timing-recovery scheme adjust the receiver gain and sample-timing phase to minimize sample-amplitude errors and undesired intersymbol interference; a scheme for the adjustment of the timing phase is described in the article of K. H. Mueller and M. Müller, "Timing Recovery in Digital Synchronous Data Receivers", IEEE Trans. Commun., vol. COM-24, pp. 516-530, May 1976.

The present invention relates to magnetic/magneto-optic recording or communication systems using partial-response (PR) signaling. A general description of PR signaling principles is given by P. Kabal and S. Pasupathy in "Partial-Response Signaling", IEEE Trans. Commun., vol. COM-23, pp. 921-934, September 1975. The application of PR signaling in combination with maximum-likelihood sequence detection (MLSD) in storage systems to increase recording densities has been proposed by H. Kobayashi in "Application of Probabilistic Decoding to Digital Magnetic Recording Systems", IBM J. Res. Develop., vol. 15, pp. 64-74, January 1971. For fast initial adjustment of the gain and timing phase in receivers for systems using PR signaling, a synchronization preamble is sent prior to user data. A fast algorithm for the timing-phase adjustment is described in the European Patent Application 87116783.9, "Fast Timing Acquisition for Partial-Response Signaling", and in the article "Fast Timing Recovery for Partial-Response Signaling Systems", Proc. IEEE Int. Conf. on Communications, Boston, pp. 573-577, June 1989, of F. Dolivo, W. Schott, and G. Ungerböck. The above named article of F. Dolivo et. al. is considered the nearest prior art.

The present invention relates in particular to a method for fast and reliably recognizing in binary PR class-IV signaling systems that synchronization has been achieved and the preamble is being received, and to detect the end of preamble. No prior art is known disclosing the method of preamble recognition and synchronization detection of the present invention.

SUMMARY OF THE INVENTION

The main object of the present invention is to provide a method for fast and reliably recognizing the reception of the synchronization preamble in receivers for communication or storage systems using partial-response signaling.

Another main object is to devise a preamble reception detector that implements the disclosed method.

Use data is preceded by a synchronization preamble which consists of a timing sequence followed by a known sequence marking its end. The timing sequence does not satisfy the constraints of the rate 8/9 code used in partial-response systems and serves as a unique synchronization mark.

Another object of the present invention is to provide a fast and reliable method for recognizing that synchronization has been achieved and the timing sequence is received, and to detect the end of preamble.

The main advantage offered by the invention is that the recognition that synchronization has been achieved and the timing sequence is received, which are required to steer operations in the receiver during its start-up phase, can be achieved fast and reliably.

The inventive method for detecting preamble reception is based on a maximum-likelihood test performed on the received samples after synchronization has been achieved. This test determines whether the received samples result more likely from the timing sequence or an encoded data sequence. Once the timing sequence has been recognized, the same test is used to detect the end of the preamble. For a signal-to-noise ratio corresponding to an error-rate of the Viterbi detector of $10^{-5}$, the method is capable of achieving a probability of not recognizing the preamble when it is actually received which is below $10^{-8}$, a worst case probability of deciding for the preamble when in fact user data are received of about $10^{-12}$, and a probability of failing to recognize the end of the preamble within 4 bits which is below $10^{-18}$.

Another advantage of the inventive method is that the same maximum-likelihood test can be used to detect the end of preamble.

A further advantage of the inventive method is that it does not require the addition of a special synchronization mark in the preamble; the synchronization preamble itself serves this purpose.

Further features and advantages of the invention will become apparent from the following detailed description and drawings of a preferred embodiment.

DETAILED DESCRIPTION

The following sections give a detailed description of a method to reliably recognize in binary partial-response (PR) class-IV (PR-IV) systems that synchronization has been achieved and the preamble is being received, and to detect the end of preamble. In addition, an implementation of a preamble-reception detector is disclosed.

The synchronization preamble consists of a timing sequence followed by a known sequence of bits marking its end. The timing sequence does not satisfy the constraints of a rate 8/9 code, which is used in PR systems, and serves as a unique synchronization mark. The method for detecting preamble reception is based on a maximum-likelihood (ML) test performed on the received samples after synchronization has been achieved. This test determines whether the received samples are more likely to be caused by the timing sequence or by a rate 8/9 encoded data sequence. Once the timing sequence has been recognized, the ML test is used to detect the end of preamble.

Two kinds of errors, namely failing to recognize the preamble when it has indeed been received and falsely recognizing it when in fact user data have been received, will affect the reliability of the receiver start-up. The efficiency of the method for detecting preamble reception was assessed by computing the miss and false-alarm probabilities associated with these two events.

In Section 1, a PR system and its start-up procedure are described. The method for synchronization detection, timing sequence recognition, and the end of preamble recognition is described in Section 2. The resulting miss and false-alarm probabilities are given in Section 3. In Section 4, implementation issues are discussed.

1. Partial-Response Signaling System

Figure 1A:
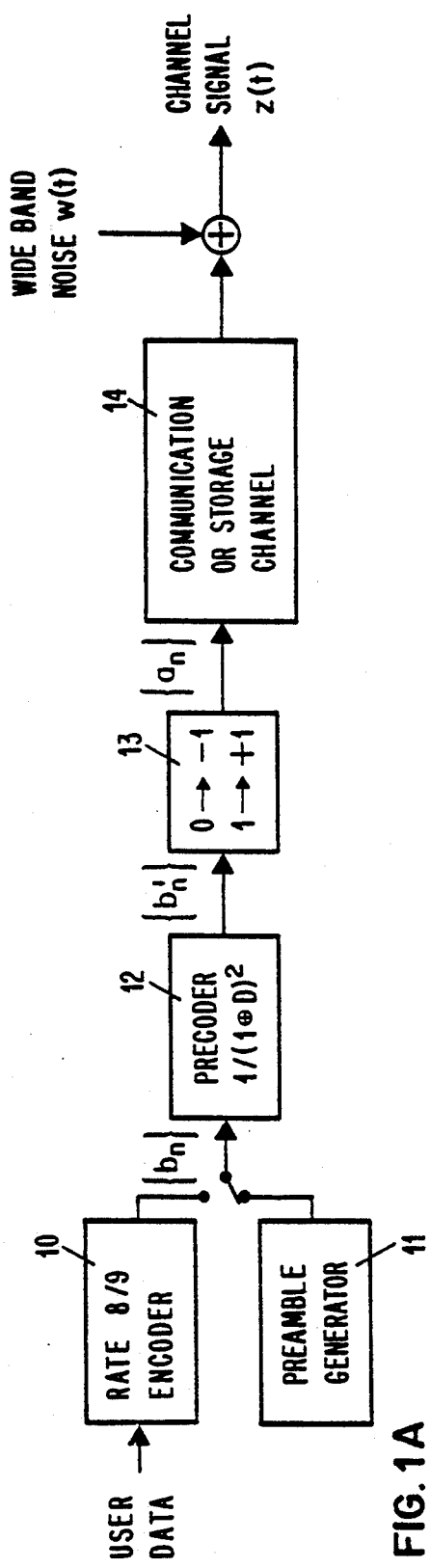
FIG. 1A is a schematic block-diagram of the transmission part of a partial-response (PR) signaling system.
Figure 1B:
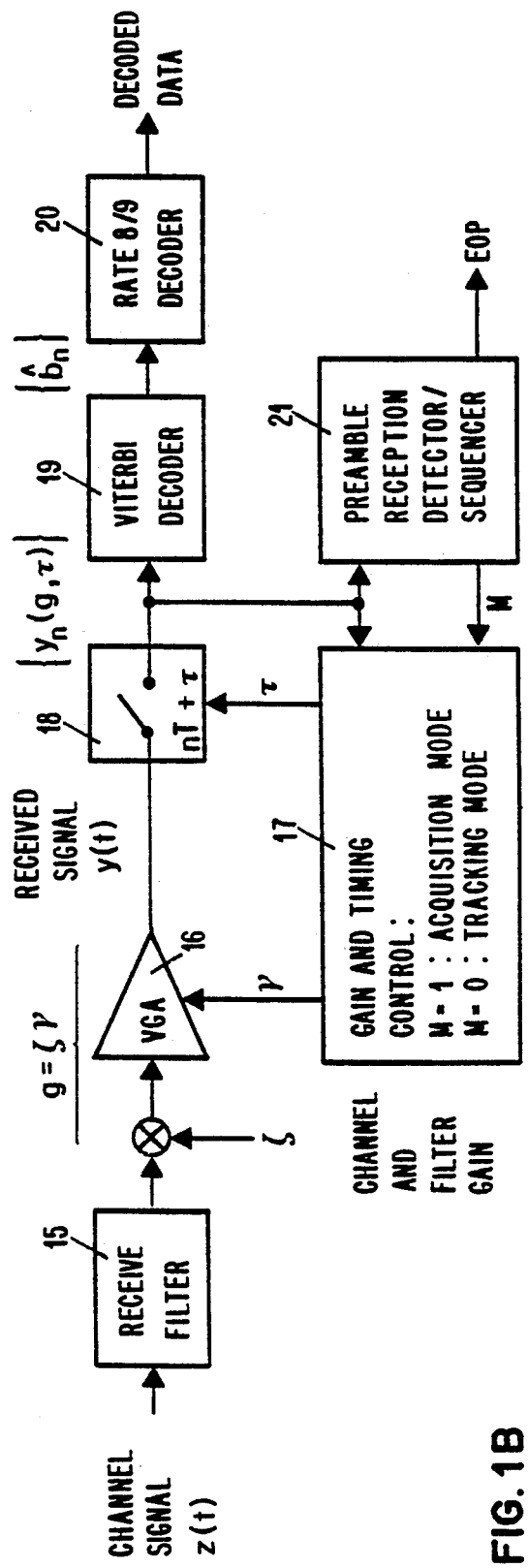
FIG. 1B is a schematic block diagram of the receiver part of a partial-response (PR) signaling system.

A PR signaling system is shown in FIG. 1A and 1B. FIG. 1A illustrates the transmission part of a PR signaling system consisting of a rate 8/9 encoder 10 and a preamble generator 11 connected via a switch to a precoder 12. The precoder 12 is followed by a converter 13 and the communication or storage channel 14. The noise present in the channel is represented at its output as additive wide-band noise w (t).

The receiver part of the PR system, shown in FIG. 1B, consists of a receive filter 15, a variable gain amplifier (VGA) 16, a sampler 18, a Viterbi decoder 19, and a rate 8/9 decoder 20. The operation of the receiver is controlled by a gain and timing control circuit 17 and a preamble reception detector/sequencer 21. The input-output relationships and the operation of these blocks are discussed in greater detail below.

The binary sequence $\{b_n\}$, $b_n$ (0,1), consisting of either user data encoded by the rate 8/9 code or the preamble sequence employed for fast receiver synchronization, is precoded into the binary sequence $\{b_n'\}=\{b_n \oplus b_{n-2}'\}$, where $\oplus$ denotes modulo 2 addition. The precoded sequence is then converted into the data sequence $\{a_n\}$ by translating $b_n'=0$ into $a_n=-1$ and $b_n'=1$ into $a_n=+1$. The sequence $\{a_n=\pm 1\}$ is sent at the signaling rate $1/T$ through a communication (transmit filter and transmission medium) or storage channel 14 and band-limiting receive filter 15. The gain $\gamma$ of the VGA 16 is adjusted to compensate the unknown gain $\zeta$ of channel 14 and receive filter 15 so that the total gain $g=\zeta\gamma$ of the overall system becomes unity. For PR-IV signaling, the response of the overall system with gain $g=1$ to an isolated input signal $a_0=+1$ is given by the class-IV partial-response signal $$h(t) = \frac{\sin[\pi t/T]}{\pi t/T} - \frac{\sin[\pi(t-2T)/T]}{\pi(t-2T)/T}. \quad (1)$$

Sampling with sampler 18 the received signal $$y(t) = g[x(t) + r(t)] = g\left[\sum_m a_m h(t-mT) + r(t)\right], \quad (2)$$

where x (t) represents the data signal and r (t) denotes noise w (t) band-limited by the receive filter 15, at times $nT+\tau$ yields $$y_n(g,\tau) = y(nT+\tau) = g\left[\sum_m a_m h[(n-m)T+\tau] + r(nT+\tau)\right]. \quad (3)$$

For the correct gain $g=1$ and timing phase $\tau=0$, at ideal sampling instants nT, the received samples are given by $$y_n(g=1, \tau=0) = x_n + r_n, \quad (4)$$

where, since $\{h(nT)\}=\{\ldots 0, h(0)=+1, 0, h(2T)=-1, 0 \ldots\}$, the data-signal samples are given by $$x_n = a_n - a_{n-2}, x_n \{-2, 0, +2\}. \quad (5)$$

The noise samples $\{r_n\}$ are assumed to be uncorrelated and Gaussian, with zero mean and standard deviation $\sigma$. The samples $\{x_n\}$ are the outputs of a discrete channel defined by the polynomial $1-D^2$, where D refers to a delay T, and depend for n even (odd) on the inputs $\{a_n, n \text{ even (odd)}\}$. Thus, PR-IV sequences can be viewed as two independent interleaved dicode PR sequences with polynomial $1-D'$, where D' refers to a delay 2T. A PR dicode system can be described by a two-state trellis diagram. The Viterbi decoder 19 operates in an interleaved fashion on the two dicode sequences and performs maximum-likelihood sequence detection by searching in the two-state trellis for the binary data sequence $\{b_n\}$ leading to the data sequence $\{X_n\}$ that exhibits the smallest Euclidian distance to the received sequence $\{y_n(g, \tau)\}$, as described in the U.S. Pat. Nos. 4,571,734, "Method and Apparatus for Decoding the Output Signal of a Partial-Response Class-IV Communication or Recording-Device Channel", and 4,644,564, "Decoding the Output Signal of a Partial-Response Class-IV Communication or Recording Device Channel". The probability $P_e$ that an error event occurs is well-approximated at moderate and high signal-to-noise ratios, as described in the already named article of G. Forney, by $$P_e \approx 2Q(d_{free}/2\sigma) = 2Q(\sqrt{2}/\sigma), \quad (6)$$

where $d_{free}=\sqrt{8}$ is the minimum Euclidian distance between any paths which separate and remerge in the two-state trellis diagram, and the Q-function is defined as $$Q(x) = \frac{1}{\sqrt{2\pi}} \int_x^\infty \exp\left(-\frac{y^2}{2}\right) dy. \quad (7)$$

The VGA gain $\gamma$ and timing phase $\tau$ are adjusted by control schemes. For initial acquisition of gain and timing phase, as given in the article "Fast Timing Recovery for Partial-Response Signaling Systems", Proc. IEEE Int. Conf. on Communications, Boston, pp. 573-577, June 1989, of F. Dolivo, W. Schott, and G. Ungerböck, the binary timing sequence $$\{b_n\} = \{\ldots 1, 1, 1, 1, 1, 1, 1, 1 \ldots\} \quad (8)$$

is sent by the preamble generator 11, resulting in the timing data sequence $$\{a_n\} = \{\ldots +1, +1, -1, -1, +1, +1, -1, -1 \ldots\}. \quad (9)$$

The data signal x (t) generated by the timing data sequence (Eq.(9)) is a sine wave of frequency $\frac{1}{4}T$, i.e., the frequency at which the amplitude of the PR-IV system is maximum. Special algorithms exploiting knowledge of the timing data sequence are employed in the acquisition mode. Different algorithms and lower control-loop gains are used for gain and phase tracking during reception of random data. The operation mode of the control schemes is determined by a preamble-reception detector and sequencer 21 shown in FIG. 1B.

Codes for PRML (partial-response signaling and maximum-likelihood sequence detection) systems, as described in the European Patent Application 89810607.5, "Rate 8/9 Codes for Fast Start-up of PRML Receivers", can be described by the parameters (M, N, K), where M and K are the maximum run-length of 0's and 1's in the encoded binary sequence and N is the maximum number of consecutive 0's in the two subsequences with even or odd time indices. The constraint on M limits the run-length of zero-valued data-signal samples and guarantees satisfactory operation of gain and timing control. The constraint on N assures proper operation of the Viterbi decoder 19 with a path-memory length of 2N bits. The constraint on K ensures that the all-1 binary timing sequence (Eq.(8)) can be employed as a unique synchronization mark.

2. Preamble Recognition

Figure 2:
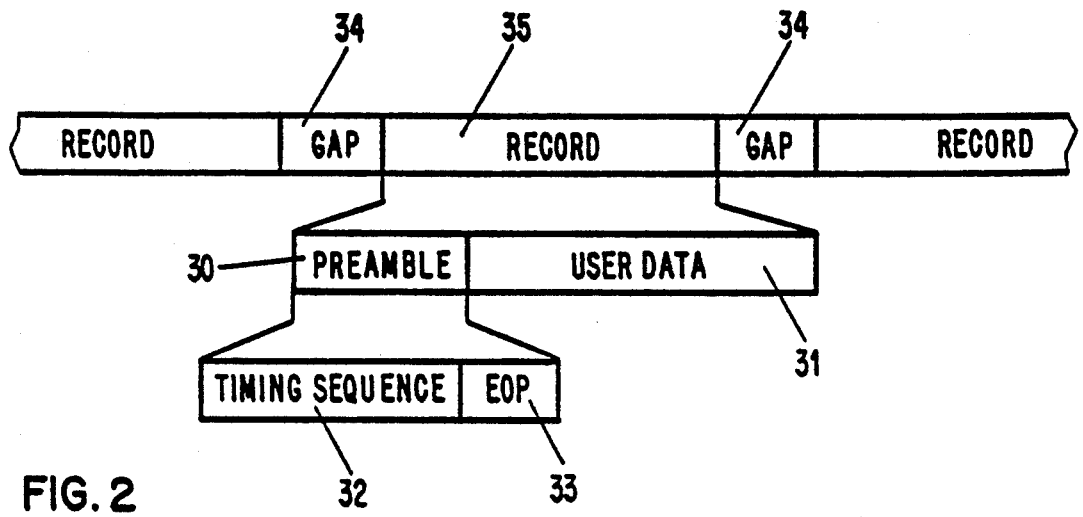
FIG. 2 is a schematic representation of the track organization in magnetic recording systems.

In a magnetic recording system, the data are organized on a track as shown in FIG. 2. As can be seen, records 35 consist of a synchronization preamble 30 followed by rate 8/9 encoded user data 31 and are separated by gaps 34. A gap is filled with a special rate 8/9 encoded sequence that is appended to the beginning and the end of a record. Since records 35 are written independently of each other, the filling sequence following a record 35 partly overlaps that preceding the next record, and timing-phase continuity is not maintained in the gap. The synchronization preamble 30 comprises a timing sequence 32 for fast initial acquisition of gain and timing phase, and an end-of-preamble flag (EOP) 33 to mark the end of the preamble 30. The timing sequence 32 is a unique synchronization mark that will be discriminated from rate 8/9 encoded data by a ML (maximum-likelihood) test. This test assumes that the received samples exhibit the PR-IV signaling format (see Eqs.(4) and (5)) and must therefore be performed when gain and timing phase are correctly adjusted, i.e., after synchronization. Once the timing sequence has been recognized, the same ML test can then be used to detect the end-of-preamble flag 33.

2.1. Synchronization Detection

To achieve initial acquisition of the gain and timing phase, algorithms exploiting knowledge of the timing data sequence are activated in the receiver. Since $a_n = -a_{n-2}$ in the timing data sequence (Eq.(9)), the data signal (Eq.(5)) is given by $$x_n = 2a_n, \quad (10)$$

resulting in the two-level data-signal sequence $$\{x_n\} = \{\ldots +2, +2, -2, -2, +2, +3, -2, -2 \ldots\}. \quad (11)$$

The gain control and timing recovery techniques are based on the computation of gain and timing gradients from received signal samples and estimates of the data signals (Eq.(11)). For timing-phase acquisition, it has been shown in the article of F. Dolivo, W. Schott, and G. Ungerböck, "Fast Timing Recovery for Partial-Response Signaling Systems" that, to eliminate hangup situations at the unstable equilibrium point halfway between the desired sampling instants, data-signal estimates should be reconstructed with a variable decision threshold, i.e., $$x_n = \begin{cases} +2 & \text{for } y_n(g, \tau) \geq \eta_n \\ -2 & \text{for } y_n(g, \tau) < \eta_n, \end{cases} \quad (12)$$

where the decision threshold $\eta_n$ is given by $$\eta_n = \epsilon \text{ sign } (X_{n-2}), \epsilon \geq 0. \quad (13)$$

The error $$e_n = y_n(g, \tau) - x_n \quad (14)$$

reduces to the noise $r_n$ as the gain g and timing phase $\tau$ converge to their correct settings $g=1$ and $\tau=0$ (see Eq.(4)). Thus, correct adjustment of the gain and timing phase can be inferred from the frequency of occurrence of errors of magnitude smaller than $\delta$ and will be determined from the running sum $$S_n = \begin{cases} S_{n-1} + 1 & \text{if } |e_n| < \delta \\ \max(S_{n-1} - 1, 0) & \text{otherwise.} \end{cases} \quad (15)$$

This running sum is initialized to 0 at the time the receiver is put into the acquisition mode (M=1, see FIG. 1B) and remains non-negative. Synchronization is detected when the running sum reaches the value J, i.e., at the time index $n_s$ for which $S_{ns}=J$ for the first time. Computer simulations have shown the effectiveness of this method for $\delta=0.5$ and $J=5$.

2.2. Timing-Sequence Recognition

Synchronization can be achieved not only when the preamble 30 is encountered but might also happen, given sufficient time and favorable initial conditions, while receiving rate 8/9 encoded data. These two cases will be distinguished by a test that determines whether the received samples are more likely to be caused by the rate 8/9 encoded data or by a replica of the timing data sequence (Eq.(9)) reconstructed in the receiver, $$a_n^T = \begin{cases} x_n/2 & \text{for } n = n_S, n_S + 1 \\ -a_{n-2}^T & \text{for } n \geq n_S + 2. \end{cases} \quad (16)$$

where $n_s$ is the time index at which synchronization is detected. The values of $a_n^T$ at times $n_s$ and $n_s+1$ determine the phase of the reconstructed timing data sequence and are derived from Eq.(10), with $x_n$ (see Eq.(12)) used in place of $x_n$. The non-zero variable threshold (Eq.(13)) greatly increases the likelihood that the sequence $\{x_n\}$ satisfies the condition $x_n = -x_{n-2}$, as should be the case according to Eq. (11), and makes the reconstruction method (Eq.(12)) very reliable. The probability of incorrectly reconstructing $a_n^T$ at $n=n_s$ or $n_s+1$, given by P $(\{a_n^T \neq a_n\})=Q[(2+\epsilon)/\sigma]$, is much smaller than the error-event probability $P_e$ (see Eqs.(6) and (7)). For $\epsilon=2$ and $\sigma=0.32$, we have $P_e=10^{-5}$ and P $(\{a_n^T \neq a_n\})=4\times10^{-36}$. It is thus extremely improbable that the phase of the replica (Eq.(16)) will be reconstructed incorrectly when the timing data sequence (Eq.(9)) is actually received.

Figure 3:
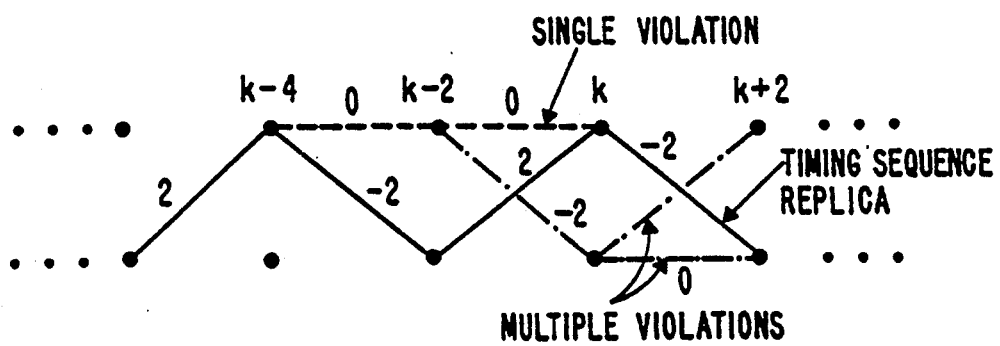
FIG. 3 shows the timing sequence replica and violations in the trellis diagram of one of the two dicode systems.

The path of the timing data sequence replica $\{a_n^T\}$ in the trellis diagram for one of the two independent dicode schemes (n even or odd) is shown in FIG. 3. A data sequence that separates from $\{a_n^T\}$ at time $n=k-4$ must remerge with it at time k to be at the minimum Euclidian distance $d_{free}=\sqrt{8}$. This single violation of $\{a_n^T\}$ at time $k-2$, $$\{a_n^V\} = \{ \ldots a_{k-6}^V = -a_k^T, a_{k-4}^V = +a_k^T, \\ a_{k-2}^V = +a_k^T, a_k^V = +a_k^T, a_{k+2}^V = -a_k^T \ldots \} \quad (17)$$

can be detected with a simple test derived from the ML principle. A single violation has occurred if the received samples $\{y_n(g, \tau)\}$ are closer in the mean-squared sense to the data samples $\{a_n^V - a_{n-2}^V\}$ than to $\{a_n^T - a_{n-2}^T\}$ (see Eq. (5)), i.e., if $$\sum_n [y_n(g, \tau) - (a_n^v - a_{n-2}^v)]^2 < \sum_n [y_n(g, \tau) - (a_n^T - a_{n-2}^T)]^2. \quad (18)$$

Using (Eq.(17)), this condition results in deciding at time k that a single violation occurred at time $k-2$ if $$a_k^T[y_k(g, \tau) - y_{k-2}(g, \tau)] < \rho, \quad (19)$$

where $\rho=2$, and that a timing pattern was present otherwise. Selecting $\rho \neq 2$ allows the decision to be biased in favor of a violation for $\rho>2$ or the timing pattern for $\rho<2$. When the gain and timing phase are correctly adjusted and for a given data sequence $\{a_n\}$, the probability that inequality (19) is not satisfied can be derived using Eqs. (4) and (5):

$$P(\{a_k^T[a_k - a_{k-2} + r_k - (a_{k-2} - a_{k-4} + r_{k-2})] \geq \rho\}) = \quad (20)$$

$$P(\{a_k^T(r_k - r_{k-2}) \geq \rho - a_k^T(a_k - 2a_{k-2} + a_{k-4})\}) =$$

$$Q[\rho - a_k^T(a_k - 2a_{k-2} + a_{k-4})]/\sqrt{2}\ \sigma).$$

The last equality follows from the fact that $a_k^T$ $(r_k - r_{k-2})$ is a zero mean Gaussian variable with a standard deviation of $\sqrt{2}\sigma$. The probability that a timing data sequence is detected at time k when actually the single violation (Eq.(17)) is present is obtained from (Eq.(20)) with $a_n = a_n^V = a_k^T$ for $n=k$, $k-2$, and $k-4$.

$$P_{T/V} = Q(\rho/\sqrt{2}\ \sigma). \quad (21)$$

The probability of the other type of error to occur, which detects a violation when a timing pattern is present, is derived from (Eq.(20)) using $a_{k-4} = -a_{k-2} = a_k = a_k^T$:

$$P_{V/T} = 1 - Q[(\rho - 4)/\sqrt{2}\ \sigma] \quad (22)$$
$$= Q[(4 - \rho)/\sqrt{2}\ \sigma].$$

For $\rho=2$, the two types of errors occur with an equal probability of $Q(\sqrt{2}/\sigma)$ which is half the error-event probability $P_e$ (see Eq.(6)).

Violations to the timing data sequence replica other than the single violation (Eq.(17)) do not remerge at time k (see FIG. 3). The probability of failing to detect these violations with the ML test (Ineq.(19)), obtained from (Eq.(20)) with $a_{k-4} = a_{k-2} = -a_k = a_k^T$, is is given by Q $[(\rho+2)/\sqrt{2}\sigma]$ and is much smaller than $P_{T/V}$ (see Eq. (21)). Such violations are therefore detected even more reliably than single violations.

The (M, N, K) codes limit the run-length of 1's in the encoded sequence $\{b_n\}$ to K and thus enforce the condition that violations to the timing data sequence $\{a_n\}$ occur at least every K+3 symbols. The timing data sequence (Eq.(9)) will be recognized when, after synchronization has been detected with the test (Eq.(15)), no more than $n_V$ violations in a sequence of $n_l$ symbols are detected with the ML test (Ineq.(19)). The probability $P_{false}^{TR}$ of falsely recognizing the timing data sequence while receiving rate 8/9 encoded data and the probability $P_{miss}^{TR}$ of failing to recognize the timing data sequence while receiving it will depend on the (M, N, K) code used and the parameters $n_V$ and $n_l$. These probabilities will be given in the next section.

An examination of the ML test (Ineq.(19)) shows that a violation to the timing data sequence replica or its inverse is detected if $$|y_k(g, \tau) - y_{k-2}(g, \tau)| < \rho. \quad (23)$$

Figure 4:
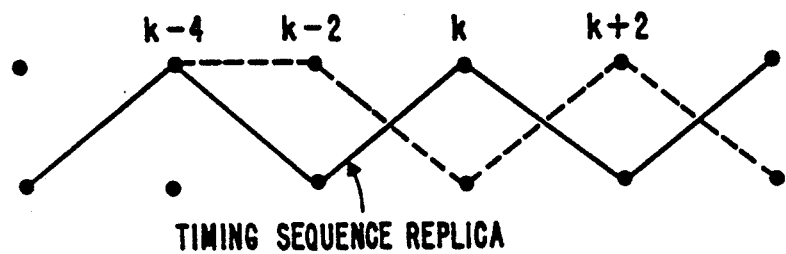
FIG. 4 shows violations resulting from a phase change after k-4 in the trellis diagram of one of the two dicode systems.

This test does not require the reconstruction (Eq.(16)) but can only detect single violations. For the case shown in FIG. 4 where $\{a_n\}$ is antiphase to $\{a_n^T\}$ starting at $n=k-2$, the probability of detecting at time k the violation at $k-2$ is only one-half when the test (Ineq.(23)) with the unbiased threshold $\rho=2$ is used. This violation can be reliably detected, with a probability of failing given by $[1-Q\,(2/\sigma)]\,Q\,(2/\sigma) \neq Q\,(2/\sigma)$, by checking at times $n=k-2$ and $n=k$ the condition $$\text{sign}\,[y_n(g,\,\tau)] = \text{sign}\,[y_{n-2}(g,\,\tau)]. \quad (24)$$

Given Eqs. (4) and (10), this test corresponds to checking whether $a_n = a_{n-2}$, thus breaching (Eq.(9)). All the violations that occur in FIG. 4 after $k-2$ cannot be recognized by test (Ineq.(23)) or (Eq.(24)). These violations resulting from a phase change to the timing data sequence are detected by the ML test (Ineq.(19)) very reliably as will be shown in the next subsection where this fact is used to develop a method for recognizing the end of preamble.

The ML test (Ineq.(19)) is not affected by a DC offset in the received samples. The synchronization detection test can also be made insensitive to DC offsets by replacing $|e_n|$ by $|e_n - e_{n-2}|$ in (Eq.(15)).

2.3. End-Of-Preamble Detection

A data pattern of opposite phase to the timing data sequence is furthest apart in terms of Euclidian distance from the timing-data sequence replica (Eq.(16)) and can be more reliably recognized by the ML test (Ineq.(19)) than any other pattern. Therefore, the end-of-preamble flag 33 is selected as shown in Table 1, $$a_1^F = +c,\ a_2^F = +d,\ a_3^F = -c,\ a_4^F = -d \ldots, \quad (25)$$

where $c = \pm 1$ and $d = \pm 1$ are the values assumed by the last two data symbols $a_{L-1}$ and $a_L$ of the timing data sequence. This choice provides the desired phase change with respect to the timing sequence replica (Eq.(16)).

The probability that the timing data sequence violation generated by the $i^{th}$ data signal in flag (Eq. (25)) is not recognized by the ML test (Ineq.(19)), it is obtained from Eq. (20) with $k = L+i$ using the sequence $\{a_k\}$ shown in Table 1 and noting that $a_{L+i}^T = -a_{L+i}$:

$$P_{fail}^F(i) = \begin{cases} Q[(\rho - 2)/\sqrt{2}\ \sigma] & \text{for } i = 1, 2 \\ Q[(\rho + 2)/\sqrt{2}\ \sigma] & \text{for } i = 3, 4 \\ Q[(\rho + 4)/\sqrt{2}\ \sigma] & \text{for } i \geq 5. \end{cases} \quad (26)$$

The end-of-preamble flag 33 will be recognized when $n_F$ violations have been detected after the timing sequence 32 has been recognized. The probability of failing to detect the end of the preamble 33 depends on the probability (Eq.(22)) of detecting a violation while still receiving the timing data sequence and the probability (Eq.(26)) of failing to recognize the violations generated by the end-of-preamble flag 33. For detecting the end-of-preamble flag 33, it may be advantageous to bias the ML test (Ineq.19) selecting $\rho = 0$ to decrease the probability $P_{V/T}$ (see Eq. (22)) which yields $P_{V/T} = P_{fail}^F$ ($i \geq 5$) $= Q\,(\sqrt{8}/\sigma)$. For $\sigma = 0.32$ corresponding to an error-event probability of $P_e = 10^{-5}$ and $\rho = 0$, we have $P_{fail}^F$ ($i = 1, 2$) $= 0.999995$, $P_{fail}^F$ ($i = 3, 4$) $= 0.5 \times 10^{-5}$, and $P_{fail}^F$ ($i \geq 5$) $= 0.5 \times 10^{-18}$.

TABLE 1

End-of-preamble (EOP) flag and timing sequence replica.

| TIMING SEQUENCE | END-OF-PREAMBLE FLAG |
|---|---|
| ... $a_{L-4}$  $a_{L-3}$  $a_{L-2}$  $a_{L-1}$  $a_L$ | $a_{L+1}$  $a_{L+2}$  $a_{L+3}$  $a_{L+4}$ ... |
| ... +d  −c  −d  +c  +d | +c  +d  −c  −d ... |
|  | $a_1^F$  $a_2^F$  $a_3^F$  $a_4^F$ ... |
| TIMING SEQUENCE REPLICA | |
| ... $a_{L-4}^T$  $a_{L-3}^T$  $a_{L-2}^T$  $a_{L-1}^T$  $a_L^T$ | $a_{L+1}^T$  $a_{L+2}^T$  $a_{L+3}^T$  $a_{L+4}^T$ ... |
| ... +d  −c  −d  +c  +d | −c  −d  +c  +d ... |

3. Miss and False-Alarm Probabilities 3.1. Timing-Sequence Recognition

After detecting synchronization, the reception of the timing data sequence will be recognized when the ML test (Ineq.(19)) detects no more than $n_V$ times the presence of a violation in a sequence of $n_l$ received samples $y_n(g, \tau)$. The parameters $n_V$ and $n_l$ have to be chosen such that the probability of failing to recognize the timing data sequence while receiving it and the probability of falsely recognizing it while actually receiving encoded data are significantly smaller than the error-event probability $P_e$ (see Eq.(6)).

The probability $P_{miss}^{TR}$ of not recognizing the timing data sequence when it is in fact received has been evaluated by calculating the probability that the ML test (Ineq.(19)) detects at least $n_V + 1$ times the reception of a violation in a sequence of $n_l$ samples (Eq.(4)) with the data signals given by (Eq.(10)). The probability $P_{false}^{TR}$ of falsely recognizing the timing data sequence while actually receiving encoded data has been evaluated under the assumption that the worst-case data sequence $\{a_n^{WC}\}$ is received after detecting synchronization at the time $n = n_s$. The worst-case sequence $\{a_n^{WC}\}$ depends on the rate 8/9 (M, N, K) code used and can be derived from the worst-case binary encoded data sequence $\{b_n^{WC}\}$. The worst-case sequence $\{b_n^{WC}\}$ of the (4,4,9), (4,6,5) and (4,6,4) code (see European Patent Application 89810607.5, "Rate 8/9 Codes for Fast Start-up of PRML Receivers") are depicted in Table 2. A comparison of these sequences to the binary timing sequence $\{b_n\}$ (see Eq.(8)) indicates the number $n_l$ of received samples which have to be processed with the ML test to make sure that at least $n_p$ violations will occur in a sample sequence of length $n_l$ while receiving encoded data. To discriminate the timing data sequence from an encoded data sequence, the parameter $n_V$ has to be less than $n_p$.

In Table 3, the miss and false-alarm probabilities $P_{miss}^{TR}$ and $P_{false}^{TR}$ for timing-sequence recognition are given for various parameters $n_p$ and $n_V$ if the (4,4,9), (4,6,5) or (4,6,4) code is used.

TABLE 2

Worst-case binary encoded data sequences.

| time index n: | $n_s$ |
|---|---|
| timing sequence $\{b_n\}$: | ...1111111111111111111111111111111... |
| (4, 4, 9) encoded data $\{b_n^{WC}\}$: | ...011111111101011111010111111010... |
| (4, 6, 5) encoded data $\{b_n^{WC}\}$: | ...01111101011111010111111010... |
| (4, 6, 4) encoded data $\{b_n^{WC}\}$: | ...0111101011110101111010... |

The probabilities were calculated for an error-event probability of $P_e = 10^{-5}$. The decision threshold $\rho$ of the ML test (Ineq.(19)) was set to 2. In the first column of this table, the number $n_l$ of received samples to be checked with the ML test (Ineq.(19)) is given as a function of the parameter $n_p$. A miss probability of about $10^{-8}$ and a false-alarm probability of about $10^{-12}$ can be achieved by selecting $n_I$ so that at least $n_p=3$ violations occur in the received sample sequence of length $n_I$ while receiving encoded data and deciding that a timing data sequence was received if the ML test (Ineq.(19)) detects no more than $n_V=1$ violation.

3.2. End-of-Preamble Flag Recognition quired, it is advantageous to increase the number $n_F$ or to bias the decision threshold $\rho$ of the ML test (see Ineq.(19)) towards a smaller value while searching for the end-of-preamble flag. For $\rho=1$ and $n_F=1$, false alarms are extremely unlikely while the risk of missing the end-of-preamble flag after receiving its first four data signals is increased compared to the results obtained for $\rho=2$ and $n_F=2$.

TABLE 3

Miss and false-alarm probabilities (timing-sequence recognition). Timing data sequence detected if no more than $n_V$ violations are recognized in a sequence of $n_I$ received samples; false-alarm probabilities are computed for worst-case encoded data sequence.

| | | $n_V = 0$ | | $n_V = 1$ | | $n_V = 2$ | |
|---|---|---|---|---|---|---|---|
| $n_p$ | $n_I$ | $P_{miss}^{TR}$ | $P_{false}^{TR}$ | $P_{miss}^{TR}$ | $P_{false}^{TR}$ | $P_{miss}^{TR}$ | $P_{false}^{TR}$ |
| | | (4, 4, 9) code, $\rho = 2$, $P_e = 10^{-5}$ | | | | | |
| 1 | 12 | $6.0 \times 10^{-5}$ | $1.2 \times 10^{-6}$ | | | | |
| 2 | 21 | $1.0 \times 10^{-4}$ | $1.6 \times 10^{-12}$ | $5.2 \times 10^{-9}$ | $6.2 \times 10^{-7}$ | | |
| 3 | 30 | $1.5 \times 10^{-4}$ | $2.0 \times 10^{-18}$ | $1.1 \times 10^{-8}$ | $1.2 \times 10^{-12}$ | $5.1 \times 10^{-13}$ | $2.3 \times 10^{-7}$ |
| | | (4, 6, 5) code, $\rho = 2$, $P_e = 10^{-5}$ | | | | | |
| 1 | 8 | $4.0 \times 10^{-5}$ | $1.2 \times 10^{-6}$ | | | | |
| 2 | 16 | $8.0 \times 10^{-5}$ | $1.6 \times 10^{-12}$ | $3.0 \times 10^{-9}$ | $6.2 \times 10^{-7}$ | | |
| 3 | 24 | $1.2 \times 10^{-4}$ | $2.0 \times 10^{-18}$ | $6.9 \times 10^{-9}$ | $1.2 \times 10^{-12}$ | $2.5 \times 10^{-13}$ | $2.3 \times 10^{-7}$ |
| | | (4, 6, 4) code, $\rho = 2$, $P_e = 10^{-5}$ | | | | | |
| 1 | 7 | $3.5 \times 10^{-5}$ | $1.2 \times 10^{-6}$ | | | | |
| 2 | 14 | $7.0 \times 10^{-5}$ | $1.6 \times 10^{-12}$ | $2.3 \times 10^{-9}$ | $6.2 \times 10^{-7}$ | | |
| 3 | 21 | $1.0 \times 10^{-4}$ | $2.0 \times 10^{-18}$ | $5.2 \times 10^{-9}$ | $1.2 \times 10^{-12}$ | $1.7 \times 10^{-13}$ | $2.3 \times 10^{-7}$ |

TABLE 4

False-alarm and miss probabilities (end-of-preamble (EOP) flag recognition). EOP flag detected as soon as $n_F$ violations are recognized after timing-sequence recognition.

| $n_F$ | $P_{false}^{FR}$ | $P_{miss}^{FR}$ (1) | $P_{miss}^{FR}$ (2) | $P_{miss}^{FR}$ (3) | $P_{miss}^{FR}$ (4) | $P_{miss}^{FR}$ (5) | $P_{miss}^{FR}$ (6) |
|---|---|---|---|---|---|---|---|
| | | $\rho = 2$, $P_e = 10^{-5}$, $L - n_T = 27$ | | | | | |
| 1 | $1.3 \times 10^{-4}$ | 0.5 | $2.5 \times 10^{-1}$ | $1.2 \times 10^{-19}$ | $5.9 \times 10^{-38}$ | $1.2 \times 10^{-77}$ | |
| 2 | $8.8 \times 10^{-9}$ | 1.0 | $7.5 \times 10^{-1}$ | $2.5 \times 10^{-1}$ | $2.4 \times 10^{-19}$ | $5.9 \times 10^{-38}$ | $2.4 \times 10^{-77}$ |
| 3 | $3.7 \times 10^{-13}$ | 1.0 | 1.0 | $7.5 \times 10^{-4}$ | $2.5 \times 10^{-1}$ | $2.4 \times 10^{-19}$ | $5.9 \times 10^{-38}$ |
| | | $\rho = 0$, $P_e = 10^{-5}$, $L - n_T = 27$ | | | | | |
| 1 | $1.4 \times 10^{-17}$ | 1.0 | 1.0 | $5.0 \times 10^{-6}$ | $2.5 \times 10^{-11}$ | $1.2 \times 10^{-29}$ | $5.7 \times 10^{-48}$ |
| 2 | $8.9 \times 10^{-35}$ | 1.0 | 1.0 | 1.0 | $9.9 \times 10^{-6}$ | $2.5 \times 10^{-11}$ | $2.4 \times 10^{-29}$ |
| 3 | $3.7 \times 10^{-52}$ | 1.0 | 1.0 | 1.0 | 1.0 | $9.9 \times 10^{-6}$ | $2.5 \times 10^{-11}$ |

The end-of-preamble flag (see Eq.(25)) will be recognized as soon as the ML test (Ineq.(19)) detects $n_F$ violations in the received sample sequence after the timing data sequence has been recognized at time $n = n_T$. The parameter $n_F$ has to be chosen such that the probability of falsely deciding that an end-of-preamble flag was received while still receiving the timing data sequence and the probability of failing to recognize the flag when it is received are again smaller than the error-event probability $P_e$ (see Eq.(6)).

Figure 5:
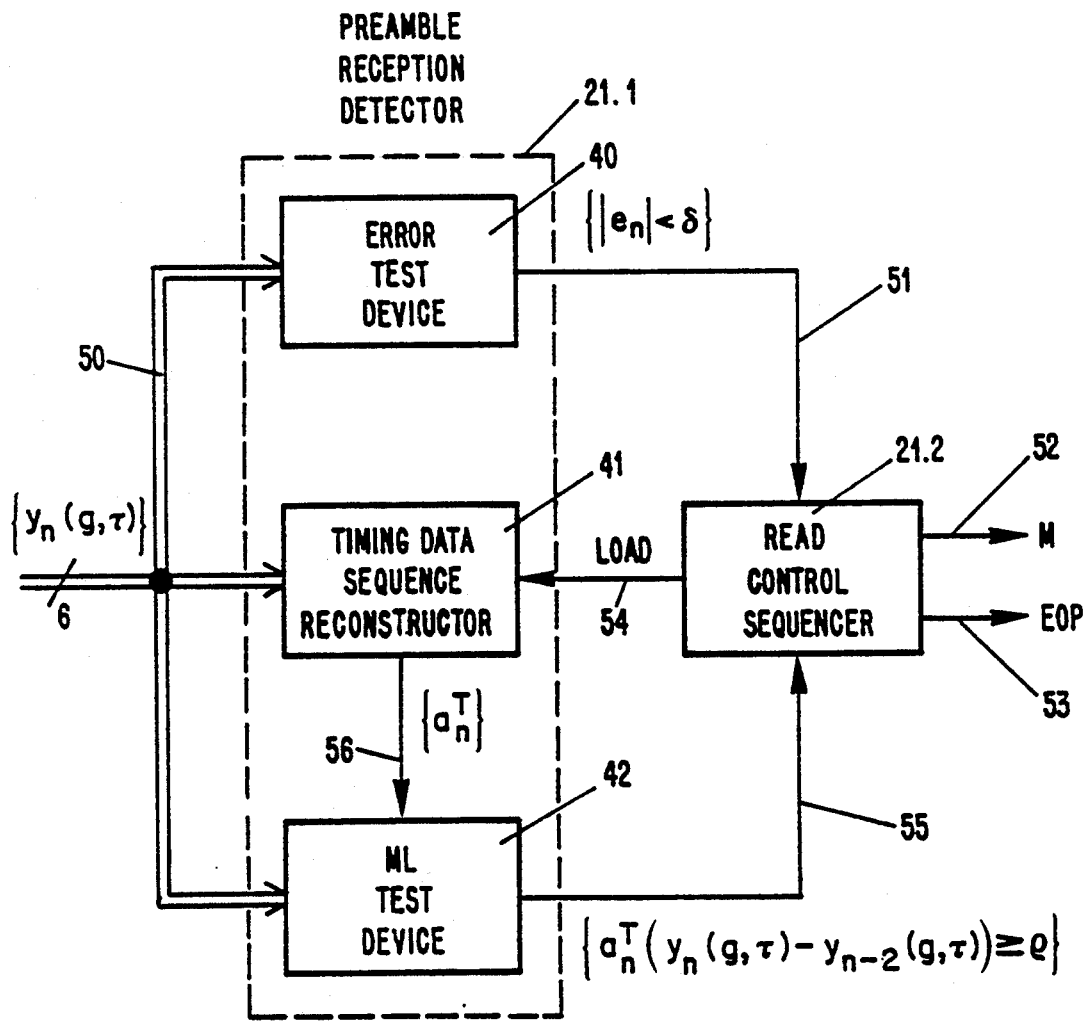
FIG. 5 is a schematic block-diagram of a preamble-reception detector and a read control sequencer.

In Table 4, the probability $P_{false}^{FR}$ of falsely accepting flag reception while still receiving the timing data sequence and the probability $P_{miss}^{ER}$ (I) of not recognizing the end-of-preamble flag before or while receiving its $I^{th}$ data signal are given as a function of the parameters I and $n_F$. The probabilities were calculated for an error-event probability of $P_e = 10^{-5}$ and it was assumed that $L - n_T = 27$ timing data sequence samples are received after timing-sequence recognition. The decision threshold $\rho$ of the ML test (Ineq.(19)) was set to 2 or 0, respectively. When $\rho = 2$, the parameter $n_F$ has to be greater than or equal to 2 to guarantee that the false-alarm probability $P_{false}^{FR}$ is smaller than the error-event probability $P_e$. For $n_F = 2$, $P_{false}^{FR}$ is less than $10^{-8}$ and the probability of not recognizing the end-of-preamble flag before or while receiving its fourth data signal is less than $10^{-18}$. Therefore, the flag will most probably be recognized during the reception of its first four data signals. When smaller false-alarm probabilities are re- 4. Implementation of the Preamble-Reception Detector/Sequencer FIG. 5 shows a block diagram of the preamble-reception detector 21.1 and read-control sequencer 21.2. The detector 21.1 comprises the timing data sequence reconstructor 41, the error test device 40 and the ML test device 42, performing the error test $|e_n| < \delta$ (see Eqs. (14) and (15)) and the ML test (Ineq.(19)) on the received samples $\{y_n(g, \tau)\}$. The results of the tests are passed to the sequencer 21.2.

The read-control sequencer 21.2 steers the start-up procedure of the receiver (see FIG. 1B). Before receiving the synchronization preamble 30, the sequencer 21.2 is reset to its initial state and the three read-control signals M, EOP, and LOAD are set to '0'. At the beginning, the sequencer monitors the error-test results. When the error test is passed (violated), the sequencer counts up (down) until the running sum $S_n$ (Eq.(15)) reaches the value J. At this time, synchronization is detected and the signal LOAD is raised for one cycle, enforcing the timing data sequence reconstructor 41 to determine the phase of the timing data sequence replica $\{a_n^T\}$. Afterwards, the sequencer counts how many times the ML test (Ineq.(19)) is violated. When $n_V + 1$ violations occur in any sequence of $n \leq n_I$ tests, the sequencer is immediately reset to its initial state restarting the start-up procedure. When no more than $n_V$ violations occur in a sequence of $n_I$ tests, the sequencer decides for the presence of the timing data sequence. The control signal M is raised and enforces a switch of the operation mode of the gain and timing control loop from acquisition to tracking. After the timing data sequence has been recognized, the sequencer keeps counting the number of violations obtained with the ML test (Ineq.(19)). The end-of-preamble flag 33 is found after detecting $n_F$ further violations. At this time, the signal EOP is raised.

Figure 6:
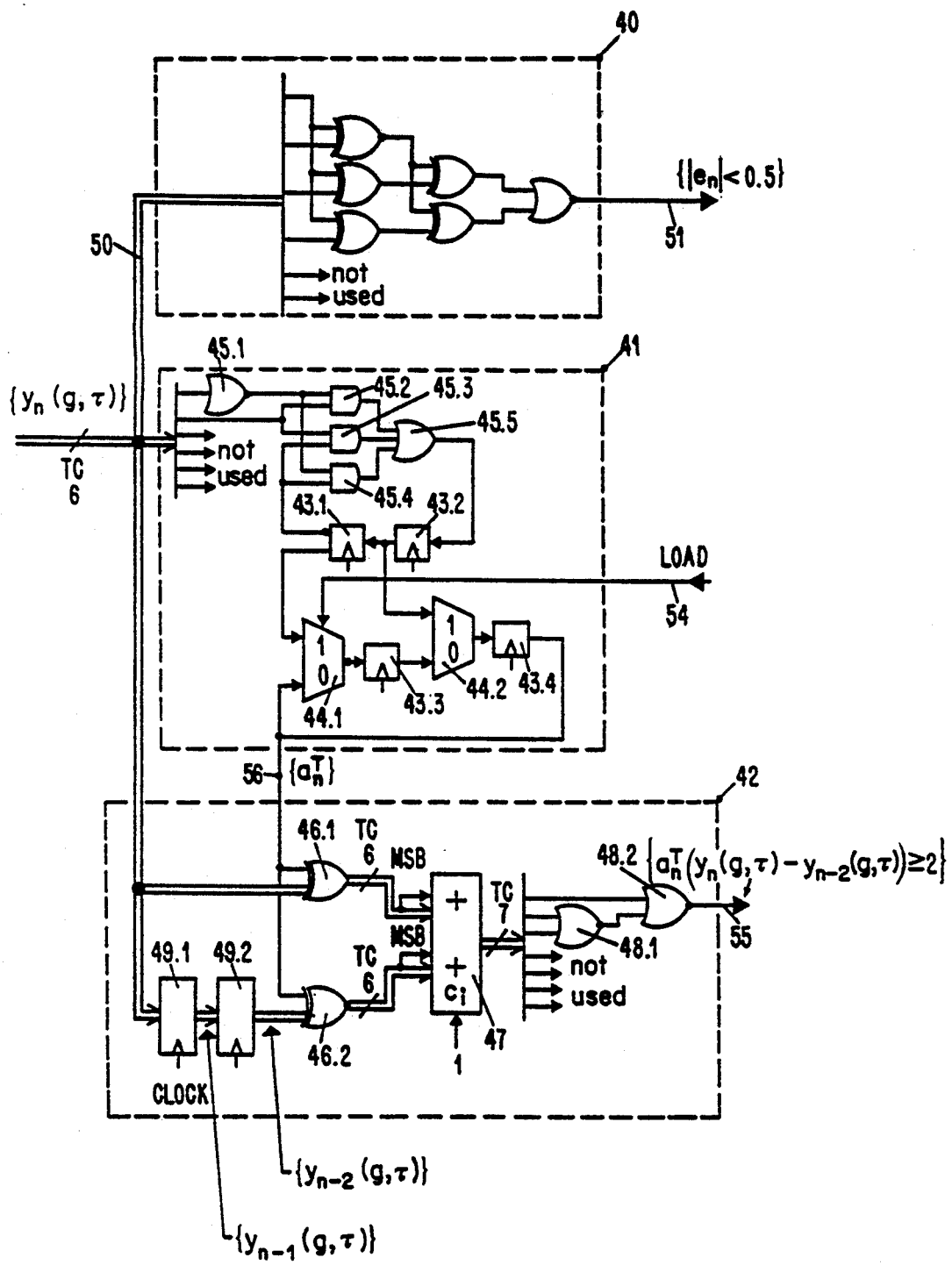
FIG. 6 is an implementation of the preamble-reception detector shown in FIG. 5.

FIG. 6 shows a circuit implementation of the preamble-reception detector 21.1. The input sample $y_n(g, \tau)$ is quantized with 6 bits and represented in 2's complement (TC) form. The weight of its least-significant bit (LSB) is 0.125. The values of the samples $y_n(g, \tau)$ are shifted by a displacement of ½ LSB corresponding to an offset of 0.0625; this displacement has been intentionally introduced by the adjustment of the sampler 18 (analog-to-digital converter) to simplify the digital hardware design.

An implementation of the error test device 40 with discrete logic is shown at the top of FIG. 6. The EX-OR/NOR circuit 40 outputs a '1' if the absolute value of the error $e_n = y_n(g, \tau) - X_n$ (see Eq.(14)) is less than $\delta = 0.5$, where the data-signal sample $X_n$ is reconstructed with a fixed decision threshold $\eta_n$ set to zero (see Eqs.(12) and (13)). Other implementations of the error test device are conceivable.

An implementation of the timing data sequence reconstructor 41 with four registers 43.1–43.4, two 2-way multiplexors 44.1 and 44.2 and five logic gates 45.1–45.5 is shown in the center part of this figure. The logic gates 45.1–45.5 reconstruct the data-signal sample $X_n$ from the received sample $y_n(g, \tau)$ with a variable decision threshold $\eta_n$ (see Eq.(13)), where the parameter $\epsilon$ is set to 2. The value of the threshold depends on the previously reconstructed sample $X_{n-2}$. The feedback loop below the variable decision threshold circuit comprising two registers 43.3 and 43.4 and the multiplexors 44.1 and 44.2 constitutes an oscillator. It generates the binary periodic timing data sequence replica $\{a_n^T\}$. Its phase is determined from the reconstructed data-signal samples $X_{n-1}$ and $X_{n-2}$ when the read-control signal LOAD is high (see Eq.(16)).

One example of an implementation of the ML test (Ineq.(19)) is shown in the lower part of this figure. The circuit outputs a '1' if the inequality (19) with $\rho = 2$ is violated. The left-hand side of this inequality is computed by feeding the received sample $y_n(g, \tau)$ and the sample $y_{n-2}(g, \tau)$ stored in register 49.2 to two EXOR 46.1 and 46.2 circuitries, each of them consisting of six gates. The register 49.1 stores the sample $y_{n-1}(g, \tau)$. Depending on the sample $a_n^T$, the products $a_n^T y_n(g, \tau)$ and $-a_n^T y_{n-2}(g, \tau)$ are computed by inverting or keeping unchanged all bits of the samples $y_n(g, \tau)$ and $y_{n-2}(g, \tau)$, respectively. The results are added with a 7-bit full adder 47. At this stage, the seventh bit with weight 0.0625 of the samples $y_n(g, \tau)$ and $y_{n-2}(g, \tau)$ is taken into account by feeding a '1' to the carry input $C_1$ of the full adder 47. When the computed sum is greater than two, the NOR circuit consisting of the gates 48.1 and 48.2 outputs a '1'.

We claim:

1. A method of recognizing reception of a preamble in receivers of storage or communication systems using partial-response (PR) signaling, in which said preamble is transmitted preceding encoded user data to achieve fast initial receiver synchronization, and said preamble consists of a timing sequence, which violates the code constraints of the particular code used, and an end-of-preamble flag, said method comprising the steps of:
   (a) detecting whether said receiver is synchronized;
   (b) after synchronization detection, reconstructing a replica $\{a_n^T\}$ generated by said timing sequence;
   (c) after reconstruction of said replica $\{a_n^T\}$, performing a first maximum-likelihood (ML) test based on said replica $\{a_n^T\}$ and the received samples $\{y_n(g, \tau)\}$ and indicating the presence of a violation when said first ML test is satisfied;
   (d) repeating said first ML test on a sequence of $n_l$ received samples $\{y_n(g, \tau)\}$, and counting the number of detected violations;
   (e) restarting with step (a) when the number of detected violations exceeds $n_v$ in any sequence of $n \leq n_l$ tests, and indicating recognition of said timing sequence when said first ML test detects no more than $n_v$ violations in a sequence of $n_l$ successive tests, $n_v$ being the number of detected violations in a sequence of $n_l$ received samples required to provide a probability having less than a predetermined value of both failing to recognize said timing sequence while receiving it and falsely recognizing the timing sequence while receiving said encoded user data;
   (f) after recognition of said timing sequence, performing a second maximum-likelihood (ML) test based on the replica $\{a_n^T\}$ and the received samples $\{y_n(g, \tau)\}$, and indicating the presence of a violation when said second ML test is satisfied;
   (g) repeating said second ML test on the sequence of received samples, and counting the number of detected violations; and
   (h) indicating recognition of said end-of-preamble flag as soon as $n_F$ violations have been detected, $n_F$ being the number of detected violations in the received sample sequence after the recognition of the timing sequence required to provide a probability having less than a predetermined value of both falsely recognizing that an end-of-preamble flag was received while continuing to receive the timing sequence and failing to recognize the end-of-preamble flag when it is received.

2. The method of claim 1, wherein said first maximum-likelihood test of step (c) is $a_n^T(y_n(g, \tau) - y_{n-2}(g, \tau)) < \rho_1$, $\rho_1$ being a given first ML test threshold.

3. The method of claim 1, wherein said second maximum-likelihood test of step (f) is $a_n^T(y_n(g, \tau) - y_{n-2}(g, \tau)) < \rho_2$, $\rho_2$ being a given second ML test threshold.

4. The method of claim 1, wherein the same maximum-likelihood test $a_n^T(y_n(g, \tau) - y_{n-2}(g, \tau)) < \rho$, $\rho$ being an ML test threshold, is used in step (c) and step (f).

5. The method of claim 4, wherein said ML test threshold $\rho = 2$.

6. The method of claim 1, wherein the step of detection of receiver synchronization comprises the steps of:
   (a) reconstructing a data-signal estimate $X_n$ from the received sample $y_n(g, \tau)$ and determining the error $e_n = y_n(g, \tau) - X_n$; and
   (b) determining said error for a sequence of received samples and indicating synchronization when said error takes on a given small value, in particular this value being smaller than 0.5.

7. The method of claim 6, wherein the step of detection of receiver synchronization further comprises the steps of comparing the magnitude of said error $e_n$ to a threshold $\delta$ and determining the running sum $$S_n = \begin{cases} S_{n-1} + 1 & \text{if } |y_n(g, \tau) - x_n| < \delta \\ \max(S_{n-1} - 1, 0) & \text{if } |y_n(g, \tau) - x_n| \geq \delta, \end{cases}$$

where the running sum is initialized to 0, and indicating synchronization when the running sum $S_n$ reaches the value of a first variable J.

8. The method of claim 7, wherein said first variable $J=5$ and the threshold $\delta=0.5$.

9. The method of claim 6, wherein said data-signal estimate $X_n$ is reconstructed from the received sample $y_n(g, \tau)$ with a variable decision threshold $\eta_n$, as given by $$x_n = \begin{cases} +2 & \text{for } y_n(g, \tau) \geq \eta_n \\ -2 & \text{for } y_n(g, \tau) < \eta_n, \end{cases}$$

where said variable decision threshold $\eta_n$ is given by $$\eta_n = \epsilon \operatorname{sign}(x_{n-2}),$$

with a second variable $\epsilon \geq 0$.

10. The method of claim 7, wherein said data-signal estimate $x_n$ is reconstructed from the received sample $y_n(g, \tau)$ with a variable decision threshold $\eta_n$, as given by $$x_n = \begin{cases} +2 & \text{for } y_n(g, \tau) \geq \eta_n \\ -2 & \text{for } y_n(g, \tau) < \eta_n, \end{cases}$$

where said variable decision threshold $\eta_n$ is given by $$\eta_n = \epsilon \operatorname{sign}(x_{n-2}),$$

with a second variable $\epsilon \geq 0$.

11. The method of claim 1, wherein said replica $\{a_n^T\}$ generated by said timing sequence is reconstructed according to $$a_n^T = \begin{cases} x_n/2 & \text{for } n = n_s, n_s + 1 \\ -a_{n-2}^T & \text{for } n \geq n_s + 2, \end{cases}$$

where a data-signal estimate $x_n$ is determined from the received sample $y_n(g, \tau)$ with a variable decision threshold $\eta_n$, and $n_s$ being the time index at which synchronization is detected.

12. In a receiver of a storage or communication system using partial-response (PR) signaling, in which a preamble is transmitted preceding encoded user data to achieve fast initial receiver synchronization, and said preamble comprises a timing data sequence, which violates the code constraints of the particular code used, and an end-of-preamble flag, a preamble-reception detector/sequencer comprising:

a preamble-reception detector for processing received samples $\{y_n(g, \tau)\}$ coupled to a preamble-reception detector input and comprising:

an error test device connected to said preamble-reception detector input for performing an error test $|y_n(g, \tau)-x_n| < \delta$, where $\delta$ is a threshold, and indicating at an error test device output the result of the test and $x_n$ is a reconstructed timing data signal estimate;

a timing data sequence reconstructor connected to said preamble-reception detector input for generating a timing data sequence replica $\{a_n^T\}$ when receiving at a second input an indication that said receiver of a storage or communication system is synchronized and providing said replica $\{a_n^T\}$ at a timing data sequence reconstructor output; and a maximum-likelihood (ML) test device connected to said preamble-reception detector input and to said timing data sequence reconstructor output for performing an ML test $a_n^T|(y_n(g, \tau)-y_{n-2}(g, \tau))| < \rho, -\rho$ being an ML test threshold, and indicating at an ML test device output the result of the test; and a read control sequencer connected to said error test device output and said ML test device output for indicating at said second input of the timing data sequence reconstructor when receiver synchronization is achieved and at a first read control sequencer output and a second read control sequencer output when the timing data sequence and end-of-preamble flag have been detected, respectively.

13. The preamble reception detector of claim 12, wherein:

said received samples $\{y_n(g, \tau)\}$ coupled to said preamble-reception detector input are quantized with 6 bits and represented in 2's complement form; and said error test device comprises an EXOR/NOR circuit and indicates at said error test device output if $|y_n(g, \tau)-x_n|$ is less than said threshold $\delta$, where the timing data signal estimate is reconstructed with a fixed decision threshold $\eta_n$.

14. The preamble-reception detector of claim 13, wherein the value of said threshold $\delta=0.5$ and the value of said fixed decision threshold $\eta_n=0$.

15. The preamble-reception detector of claim 13, wherein said timing data sequence reconstructor consists of logic gates for reconstructing, from said received samples, the timing data-signal estimates $x_n$ with a variable decision threshold $\eta_n$ given by $$\eta_n = \epsilon \operatorname{sign}(x_{n-2}),$$

where $\epsilon$ is a variable with $\epsilon \geq 0$, and an oscillator for generating said timing data sequence replica $\{a_n^T\}$, whose phase is determined from the timing data signal estimates $x_n$ when the signal fed to said second input of the timing data sequence reconstructor is raised.

16. The preamble-reception detector of claim 15 wherein the variable $\epsilon=2$.

17. The preamble reception detector of claim 13, wherein said ML test device comprises at least one register and at least one 7-bit full adder, and indicates at said ML test device output when the ML test $a_n^T[y_n(g, \tau)-y_{n-2}(g,\tau)] < 2$ is violated.

18. In a receiver of a storage or communication system using partial-response (PR) signaling, in which a preamble is transmitted preceding encoded user data to achieve fast initial receiver synchronization and said preamble comprising a timing sequence violating the code constraints of the particular code used and an end-of-preamble flag, a preamble-reception detector/sequencer comprising:

synchronization detection means for performing a synchronization test indicating when synchronization is defected;

timing-sequence recognition means coupled to said synchronization detection means and responsive to the detection of synchronization for performing a first maximum-likelihood test for the detection of said timing sequence; and end-of-preamble detection means coupled to said timing-sequence recognition means and responsive to the detection of the said timing sequence for performing a second maximum-likelihood test for the detection of said end-of-preamble flag.

19. The preamble-reception detector/sequencer of claim 18, wherein:

said synchronization detection means includes error test means for performing an error test $|y_n(g, \tau) - x_n| < \delta$, where $\delta$ is a threshold, by comparing the magnitude of the error between received samples $\{y_n(g, \tau)\}$ and reconstructed timing data-signal estimates $x_n$ to said threshold $\delta$, where said reconstructed timing data-signal estimates $x_n$ is determined from the received samples $\{y_n(g, \tau)\}$, and first sequencer means for determining a running sum $$S_n = \begin{cases} S_{n-1} + 1 & \text{if } |y_n(g, \tau) - x_n| < \delta \\ \max(S_{n-1} - 1, 0) & \text{if } |y_n(g, \tau) - x_n| \geq \delta \end{cases}$$

initialized to 0 and indicating that synchronization is detected when the running sum reaches the value of a given variable J;

said timing-sequence recognition means includes timing sequence reconstructor means for generating a timing data sequence replica $\{a_n^T\}$, means for performing a maximum-likelihood (ML) test $a_n^T |(y_n(g, \tau) - y_{n-2}(g, \tau)| < \rho_1$, where $\rho_1$ is a first ML test threshold, on the received samples $\{y_n(g, \tau)\}$, and second sequencer means for counting the number of detected violations, indicating recognition of said timing data sequence when no more than $n_v$ violations in a sequence of $n_l$ successive tests have been detected, and restarting with the synchronization test performed by said synchronization means when the number of violations exceeds $n_v$ in any sequence of $n \leq n_l$ tests, $n_v$ being the number of detected violations in a sequence of $n_l$ received samples required to provide a probability having less than a predetermined value of both failing to recognize said timing sequence while receiving it and of falsely recognizing the timing sequence while receiving said encoded user data; and said end-of-preamble detection means includes means performing the maximum-likelihood (ML) test $a_n^T |(y_n(g, \tau) - y_{n-2}(g, \tau))| < \rho_2$, where $\rho_2$ is a second ML test threshold, on the received samples $\{y_n(g, \tau)\}$ and third sequencer means for counting the number of detected violations and indicating recognition of the end-of-preamble flag as soon as $n_F$ violations have been detected, $n_F$ being the number of detected violations in the received sample sequence after the recognition of the timing sequence required to provide a probability having less than a predetermined value of both falsely recognizing that said end-of-preamble flag was received while continuing to receive the timing sequence and failing to recognize the end-of-preamble flag when it is received.

20. The preamble-reception detector/sequencer of claim 19, wherein said first and second ML test thresholds are equal and $\rho_1 = \rho_2 = 2$, the value of variable $J = 5$, and the value of threshold $\delta = 0.5$.

* * * * *

UNITED STATES PATENT AND TRADEMARK OFFICE
CERTIFICATE OF CORRECTION

PATENT NO. : 5,260,976
DATED : November 9, 1993
INVENTOR(S) : F. Dolivo et al.

It is certified that error appears in the above-indentified patent and that said Letters Patent is hereby corrected as shown below:

Column 4, line 7, delete "moduio", insert -- modulo --.

Column 6, line 29, delete "+3", insert -- +2, --.

Column 6, line 46, delete "$x_n$", insert -- $\hat{x}_n$ --.

Column 6, line 51, delete "$x_n$", insert -- $\hat{x}_n$ --.

Column 6, line 55, delete "$x_n$", insert -- $\hat{x}_n$ --.

Column 7, line 26, delete "$x_n$", insert -- $\hat{x}_n$ --.

Column 7, line 29, delete "{$x_n$}", insert -- {$\hat{x}_n$} --.

Column 7, line 29, delete "$x_n = -x_n - 2$", insert -- $\hat{x}_n = -\hat{x}_n - 2$ --.

Column 7, line 47 and 48, delete "$\{a_n^V\} = \{\ldots a_{k-6}^V = -a_k^T, a_{k-4}^V = +a_k^T, a_{k-2}^V = +a_k^T, a_k^V = +a_k^T, a_{k+2}^V = -a_k^T \ldots\}$"

insert -- $\{a_n^V\} = \{\ldots a_{k-6}^V = -a_k^T, a_{k-4}^V = +a_k^T, a_{k-2}^V = +a_k^T, a_k^V = +a_k^T, a_{k+2}^V = -a_k^T (17)\}$ --.

Column 9, line 6, delete "$a_n = a_n - 2$", insert -- $\hat{a}_n = \hat{a}_n - 2$ --.

Column 9, line 26, delete " $a_1^F = +c, a_2^F = +d, a_3^F = -c, a_4^F = -d \ldots$ "

insert -- $a_1^F = +c, a_2^F = +d, a_3^F = -c, a_4^F = -d \ldots$ , --.

Column 9, line 39, delete "$a_L +_1^T = -a_L +_1:$", insert -- $a_L +_1^T = -a_L +_1:$ --.

Column 10, line 1 and 2, delete " $P_{fail}^F (i=1, 2) = 0.999995, P_{fail}^F (i=3, 4) = 0.5 \times 10^{-5},$ and $P_{fail}^F (i \geq 5) = 0.5 \times 10^{-16}.$ "

insert -- $P_{fail}^F (i=1, 2) = 0.999995.$   $P_{fail}^F (i=3, 4) = 0.5 \times 10^{-5}.$   $P_{fail}^F (i \geq 5) = 0.5 \times 10^{-10}.$ --.

UNITED STATES PATENT AND TRADEMARK OFFICE
CERTIFICATE OF CORRECTION

PATENT NO. : 5,260,976

DATED : November 9, 1993

INVENTOR(S) : F. Dolivo et al.

Page 2 of 4

It is certified that error appears in the above-indentified patent and that said Letters Patent is hereby corrected as shown below:

Column 10, line 31, delete "$P_{false}{}^{TR}$", insert -- $P_{false}^{TR}$ --.

Column 10, line 52, delete "$P_{miss}{}^{TR}$ and $P_{false}{}^{TR}$", insert -- "$P_{miss}^{TR}$ and $P_{false}^{TR}$ --.

Column 11, line 14, delete " $n_p$, $n_f$  $P_{miss}{}^{TR}$  $P_{false}{}^{TR}$  $P_{miss}{}^{TR}$  $P_{false}{}^{TR}$  $P_{miss}{}^{TR}$  $P_{false}{}^{TR}$ " insert -- $n_p$ $n_c$  $P_{miss}^{TR}$  $P_{false}^{TR}$  $P_{miss}^{TR}$  $P_{false}^{TR}$  $P_{miss}^{TR}$  $P_{false}^{TR}$ --

Column 11, line 30, delete " $n_F$  $P_{false}{}^{FR}$  $P_{miss}{}^{FR}(1)$  $P_{miss}{}^{FR}(2)$  $P_{miss}{}^{FR}(3)$  $P_{miss}{}^{FR}(4)$  $P_{miss}{}^{FR}(5)$  $P_{miss}{}^{FR}(6)$ insert -- $n_F$  $P_{false}^{FR}$  $P_{miss}^{FR}(1)$  $P_{miss}^{FR}(2)$  $P_{miss}^{FR}(3)$  $P_{miss}^{FR}(4)$  $P_{miss}^{FR}(5)$  $P_{miss}^{FR}(6)$ --.

Column 11, line 50, delete "$P_{false}{}^{FR}$", insert -- $P_{false}^{FR}$ --.

Column 11, line 52, delete "$P_{miss}{}^{ER}$", insert -- $P_{miss}^{ER}$ --.

Column 11, line 62, delete "$P_{false}{}^{FR}$", insert -- $P_{false}^{FR}$ --.

Column 11, line 63, delete "$P_{false}{}^{FR}$", insert -- $P_{false}^{FR}$ --.

UNITED STATES PATENT AND TRADEMARK OFFICE
CERTIFICATE OF CORRECTION

PATENT NO. : 5,260,976
DATED : November 9, 1993
INVENTOR(S) : F. Dolivo, et al

It is certified that error appears in the above-indentified patent and that said Letters Patent is hereby corrected as shown below:

Column 14, line 48, delete "$a_n^T(y_n(g, T) - y_n - 2(g,$", insert -- $\hat{a}_n^T(y_n(g, \tau) - y_n - 2(g,$ --.

Column 14, line 58, delete "$X_n$", insert -- $\hat{x}_n$ --.

Column 15, line 4, delete "$x_n$", insert -- $\hat{x}_n$ --.

Column 15, line 5, delete "$x_n$", insert -- $\hat{x}_n$ --.

Column 15, line 13, delete "$x_n$", insert -- $\hat{x}_n$ --.

Column 15, line 18, delete "$x_n$", insert -- $\hat{x}_n$ --.

Column 15, line 22, delete "$(x_n-2)$", insert -- $(\hat{x}_n-2)$ --.

Column 15, line 50, delete "$x_n$", insert -- $\hat{x}_n$ --.

Column 16, line 35, delete "if$| y_n(g,T) - x_n |$", insert -- if$| y_n(g,\tau) - \hat{x}_n |$ --.

Column 16, line 44, delete "$x_n$", insert -- $\hat{x}_n$ --.

Column 16, line 46, delete "$(x_n-2)$", insert -- $(\hat{x}_n-2)$ --.

Column 16, line 50, delete "$x_n$", insert -- $\hat{x}_n$ --.

Column 17, line 18, delete "$x_n$", insert -- $\hat{x}_n$ --.

UNITED STATES PATENT AND TRADEMARK OFFICE
CERTIFICATE OF CORRECTION

PATENT NO. : 5,260,976
DATED : November 9, 1993
INVENTOR(S) : F. Dolivo et al

It is certified that error appears in the above-indentified patent and that said Letters Patent is hereby corrected as shown below:

Column 17, line 21, delete "$x_n$", insert -- $\hat{x}_n$ --.

Column 17, line 22, delete "$x_n$", insert -- $\hat{x}_n$ --.

Column 17, line 26, delete "$x_n$", insert -- $\hat{x}_n$ --.

Column 17, line 27, delete "$x_n$", insert -- $\hat{x}_n$ --.

Signed and Sealed this

Twenty-seventh Day of September, 1994

Attest:

BRUCE LEHMAN

*Attesting Officer*   *Commissioner of Patents and Trademarks*